(12) United States Patent
Song et al.

(10) Patent No.: US 9,245,986 B2
(45) Date of Patent: Jan. 26, 2016

(54) POWER SEMICONDUCTOR DEVICE AND METHOD OF MANUFACTURING THE SAME

(71) Applicant: SAMSUNG ELECTRO-MECHANICS CO., LTD., Suwon-Si (KR)

(72) Inventors: In Hyuk Song, Suwon-Si (KR); Jae Hoon Park, Suwon-Si (KR); Dong Soo Seo, Suwon-Si (KR); Chang Su Jang, Suwon-Si (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/322,346

(22) Filed: Jul. 2, 2014

(65) Prior Publication Data

US 2014/0312383 A1  Oct. 23, 2014

Related U.S. Application Data

(63) Continuation-in-part of application No. 14/149,578, filed on Jan. 7, 2014, which is a continuation of application No. 13/688,320, filed on Nov. 29, 2012, now Pat. No. 8,653,628.

(60) Provisional application No. 61/905,019, filed on Nov. 15, 2013.

(30) Foreign Application Priority Data

Jan. 6, 2014 (KR) .................. 10-2014-0001516

(51) Int. Cl.
*H01L 29/78* (2006.01)
*H01L 29/00* (2006.01)
(Continued)

(52) U.S. Cl.
CPC .......... *H01L 29/7397* (2013.01); *H01L 21/265* (2013.01); *H01L 21/26513* (2013.01); *H01L 29/36* (2013.01); *H01L 29/66348* (2013.01)

(58) Field of Classification Search
CPC ............... H01L 29/7397; H01L 29/66348; H01L 29/36; H01L 21/265; H01L 21/26513
USPC .............. 257/133, 139, 330, 334, 341, 579, 257/E29.215, E29.262, E21.19, E21.41; 438/138, 270, 561, 589
See application file for complete search history.

(56) References Cited

U.S. PATENT DOCUMENTS 7,091,552 B2 * 8/2006 Blanchard ........... H01L 29/0634
257/329
8,653,628 B1 * 2/2014 Song et al. .................... 257/579
(Continued)

FOREIGN PATENT DOCUMENTS

DE    10 2007 043 341       9/2007
JP    2010-232627           10/2010
(Continued)

OTHER PUBLICATIONS

Notice of Allowance dated Oct. 7, 2013 for U.S. Appl. No. 13/688,320 (now issued as U.S. Pat. No. 8,653,628).
(Continued)

*Primary Examiner* — Dao H Nguyen
(74) *Attorney, Agent, or Firm* — Ladas & Parry, LLP (57) ABSTRACT

A power semiconductor device may include: a base substrate including a first conductive type drift layer; a second conductive type semiconductor substrate disposed on the other surface of the base substrate; a first conductive type diffusion layer disposed in the base substrate and having an impurity concentration higher than that of the drift layer; a second conductive type well layer disposed inside of one surface of the base substrate; a trench formed from one surface of the base substrate including the well layer so as to penetrate through the diffusion layer in a depth direction; a first insulation film disposed on a surface of the base substrate; and a first electrode disposed in the trench. A peak point of an impurity doping concentration of the diffusion layer in a transverse direction may be positioned in a region contacting a side surface of the trench.

7 Claims, 10 Drawing Sheets

(51) Int. Cl.
  *H01L 21/336* (2006.01)
  *H01L 29/739* (2006.01)
  *H01L 29/66* (2006.01)
  *H01L 21/265* (2006.01)
  *H01L 29/36* (2006.01)

(56) References Cited

U.S. PATENT DOCUMENTS

| | | | |
|---|---|---|---|
| 2005/0029586 A1 | 2/2005 | Ono | |
| 2005/0056890 A1 | 3/2005 | Yasuhara et al. | |
| 2005/0167742 A1* | 8/2005 | Challa | H01L 21/3065 257/328 |
| 2006/0214221 A1* | 9/2006 | Challa | H01L 21/3065 257/328 |
| 2011/0180813 A1 | 7/2011 | Harada et al. | |
| 2011/0201187 A1* | 8/2011 | Nishiwaki et al. | 438/529 |
| 2012/0009748 A1 | 1/2012 | Ji | |
| 2013/0005130 A1* | 1/2013 | Yang | H01L 21/26586 438/589 |
| 2013/0240985 A1* | 9/2013 | Hirler et al. | 257/330 |
| 2013/0344667 A1* | 12/2013 | Qin et al. | 438/270 |
| 2014/0077290 A1* | 3/2014 | Hsieh | 257/330 |

FOREIGN PATENT DOCUMENTS

| | | |
|---|---|---|
| JP | 2011-253929 | 12/2011 |
| JP | 2012-019197 | 1/2012 |

OTHER PUBLICATIONS

*Ex Parte Quayle* Action dated Jul. 29, 2013 for U.S. Appl. No. 13/688,320 (now issued as U.S. Pat. No. 8,653,628).

Restriction Requirement dated Jun. 19, 2013 for U.S. Appl. No. 13/688,320 (now issued as U.S. Pat. No. 8,653,628).

Notice of Allowance dated Apr. 24, 2015 for U.S. Appl. No. 14/559,384 (now published as U.S. 2015/0087117).

Non-Final Office Action dated Dec. 30, 2014 for U.S. Appl. No. 14/559,384 (now published as U.S. 2015/0087117).

Office Action dated Apr. 1, 2014 for Japanese Patent Application No. 2012-259801 and its English translation provided by Applicant's foreign counsel.

Office Action dated Apr. 29, 2013 for German Patent Application No. 10 2012 111 503.6 and its English translation provided by Applicant's foreign counsel.

* cited by examiner

POWER SEMICONDUCTOR DEVICE AND METHOD OF MANUFACTURING THE SAME

CROSS-REFERENCE TO RELATED APPLICATION

This application is a continuation-in-part of application Ser. No. 14/149,578 filed on Jan. 7, 2014, which is a continuation of application Ser. No. 13/688,320 filed on Nov. 29, 2013, and claims the benefit of U.S. Provisional Patent Application No. 61/905,019 filed on Nov. 15, 2013 with the U.S. Patent and Trademark Office and Korean Patent Application No. 10-2014-0001516 filed on Jan. 6, 2014 with the Korean Intellectual Property Office, the disclosure of which are incorporated in their entireties herein by reference.

BACKGROUND

The present disclosure relates to a power semiconductor device and a method of manufacturing the same.

Recently, due to significant progress in terms of the manufacturing of insulated gate bipolar transistor (IGBT) devices having various shapes, IGBTs have been widely used in large capacity industrial products and electric automobiles as well as in domestic appliances.

A main advantage of the IGBT device is a bipolar operation unlike a metal oxide semiconductor field-effect transistor (MOSFET), which may generate a conductivity modulation phenomenon, such that series resistance dependent on a raw material of a wafer may be decreased at the time of an on-operation.

Particularly, in high breakdown voltage and high current products, the IGBT device may have significantly low forward conduction loss as compared to the MOSFET by decreasing series resistance, such that a power loss may be decreased.

Therefore, recently, research into IGBT technology has been conducted toward the development of technology for significantly increasing a conductivity modulation phenomenon. Particularly, a technology of accumulating holes has been actively developed.

Since the holes in the IGBT device are implanted in a p-type collector layer and are gradually annihilated toward an emitter layer, the closer the emitter layer, the higher the conduction loss.

In order to solve this problem, a technology of decreasing an interval between trenches that becomes a final movement path of the hole, that is, a width of a mesa region to limit movement of the hole has been applied.

An insulated gate bipolar transistor (IGBT) has been disclosed in the following Related Art Document (Patent Document 1).

RELATED ART DOCUMENT (Patent Document 1) US 2011-0180813 A

SUMMARY

An aspect of the present disclosure may provide a power semiconductor device capable of significantly increasing a conductivity modulation phenomenon and a method of manufacturing the same.

According to an aspect of the present disclosure, a power semiconductor device may include: a base substrate having one surface and the other surface opposing the one surface and formed of a first conductive type drift layer; a second conductive type semiconductor substrate formed on the other surface of the base substrate; a first conductive type diffusion layer formed in the base substrate and having an impurity concentration higher than that of the drift layer; a second conductive type well layer formed inside of one surface of the base substrate; a trench formed from one surface of the base substrate including the well layer so as to penetrate through the diffusion layer in a depth direction; a first insulation film formed on a surface of the base substrate including an inner wall of the trench; and a first electrode formed in the trench, wherein a peak point of an impurity doping profile of the diffusion layer in the depth direction is positioned in a region between a lower surface of the well layer and a lower surface of the trench and a peak point of an impurity doping concentration of the diffusion layer in a transverse direction is positioned in a region contacting a side surface of the trench.

A peak point of an impurity doping profile of the diffusion layer in the depth direction may be positioned in a region between a lower surface of the well layer and a lower surface of the trench.

A peak point of an impurity doping profile of the well layer in the depth direction may be positioned in one surface of the base substrate.

The diffusion layer may be formed in a semicircular shape on at least one side based on a central portion of the trench and contact a diffusion layer adjacent thereto to form a single layer.

A peak point of an impurity doping profile of the diffusion layer in the depth direction may be formed to be spaced apart from the well layer in the depth direction.

A path through which holes move may be formed in a central portion of the diffusion layer when high current flows.

According to another aspect of the present disclosure, a power semiconductor device may include: a base substrate having one surface and the other surface opposing the one surface and formed of a first conductive type drift layer; a second conductive type semiconductor substrate formed on the other surface of the base substrate; a first conductive type diffusion layer formed in the base substrate and having an impurity concentration higher than that of the drift layer; a second conductive type well layer formed inside of one surface of the base substrate; a trench formed from one surface of the base substrate including the well layer so as to penetrate through the diffusion layer in a depth direction; a first insulation film formed on a surface of the base substrate including an inner wall of the trench; and a first electrode formed in the trench, wherein a peak point of an impurity doping profile of the diffusion layer in the depth direction is positioned in a region between a lower surface of the well layer and a lower surface of the trench.

According to another aspect of the present disclosure, a method of manufacturing a power semiconductor device may include: preparing a base substrate having one surface and the other surface opposing the one surface and formed of a first conductive type drift layer; forming an etching mask having an open part for forming a trench in one surface of the base substrate; forming a primary trench corresponding to the open part from one surface of the base substrate in a depth direction; forming a first conductive type diffusion layer having an impurity concentration higher than the drift layer by ion implanting a first conductive type impurity into the primary trench and performing thermal diffusion treatment so that the implanted impurity diffuses toward other primary trenches adjacent thereto; completing a final trench by forming a secondary trench so as to be extended from a lower surface of the primary trench in the depth direction and penetrate through the diffusion layer; and forming a second conductive type well layer in one surface of the base substrate.

A peak point of an impurity doping concentration of the diffusion layer in a transverse direction may be positioned in a region contacting a side surface of the final trench.

A peak point of an impurity doping profile of the diffusion layer in the depth direction may be positioned in a region between a lower surface of the well layer and a lower surface of the trench.

The forming of the well layer may be performed by implanting a second conductive type impurity into one surface of the base substrate so that a peak point of a doping profile of the well layer is positioned in one surface of the base substrate.

BRIEF DESCRIPTION OF DRAWINGS

The above and other aspects, features and other advantages of the present disclosure will be more clearly understood from the following detailed description taken in conjunction with the accompanying drawings, in which:

FIG. 12, which is an enlarged view of part C of FIG. 6, is a cross-sectional view schematically illustrating flows of electron current and hole current when the power semiconductor device is turned on.

DETAILED DESCRIPTION

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

A power switch may be implemented by any one of a power metal oxide semiconductor field effect transistor (MOSFET), an insulated gate bipolar transistor (IGBT), thyristors having various shapes, and devices similar to the above-mentioned devices. Most of new technologies disclosed herein will be described based on the IGBT. However, several exemplary embodiments of the present disclosure disclosed herein are not limited to the IGBT, but may also applied to other types of power switch technologies including a power MOSFET and several types of thyristors in addition to the IGBT. Further, several exemplary embodiments of the present disclosure will be described as including specific p-type and n-type regions. However, conductive types of several regions disclosed herein may be similarly applied to devices having conductive types opposite thereto.

In addition, an n-type or a p-type used herein may be defined as a first conductive type or a second conductive type. Meanwhile, the first and second conductive types mean different conductive types.

Further, generally, '+' means a state in which a region is heavily doped and '−' means a state that a region is lightly doped.

Hereinafter, although the case in which the first conductive type is the n-type and the second conductive type is the p-type will be described in order to make a description clear, the present disclosure is not limited thereto.

In the drawings, an x direction refers to a transverse direction, and a y direction refers to a depth direction.

Hereinafter, for obvious explanation, first, a method of manufacturing a power semiconductor device will be described.

Method of Manufacturing Power Semiconductor Device

FIGS. 1 through 6 are schematic process cross-sectional views for describing a method of manufacturing a power semiconductor device according to an exemplary embodiment of the present disclosure.

Hereinafter, the method of manufacturing a power semiconductor device according to an exemplary embodiment of the present disclosure will be described with reference to FIGS. 1 through 6.

Figure 1:
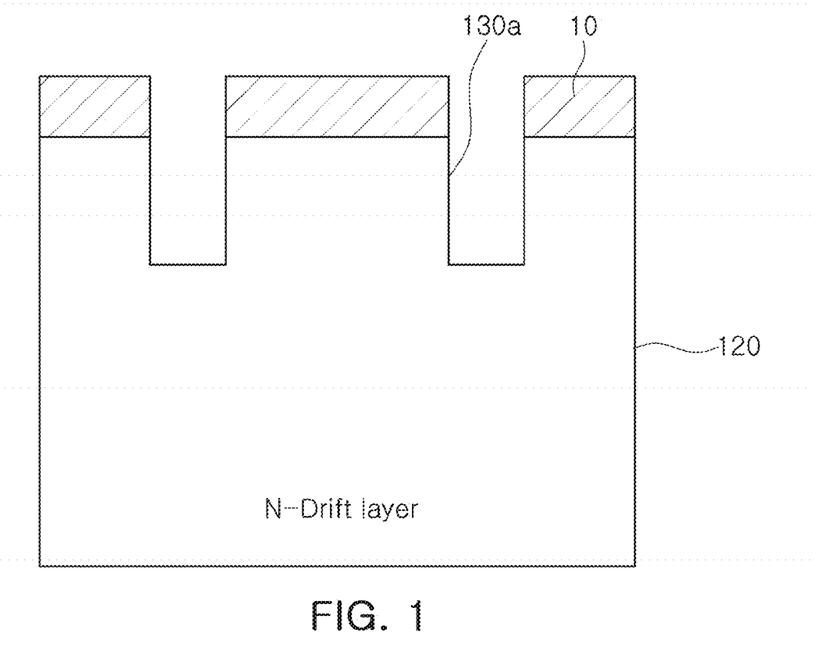
FIGS. 1 through 6 are process cross-sectional views for describing a method of manufacturing a power semiconductor device according to an exemplary embodiment of the present disclosure.

First, referring to FIG. 1, a base substrate having one surface and the other surface opposing the one surface and formed of a first conductive type drift layer 120 may be formed.

In this case, the drift layer 120 may have a conductive type corresponding to an N− type, but is not limited thereto.

Next, referring to FIG. 1, an etching mask 10 having an open part for forming a trench may be formed on one surface of the base substrate.

The etching mask 10 may be formed of an oxide.

Since the etching mask 10 is formed of the oxide, an ion implantation and thermal diffusion process may be subsequently performed.

In addition, since the etching mask 10 may be formed of the oxide, both of the primary and secondary trenches 130a and 130b may be processed using one etching mask 10.

Next, referring to FIG. 1, the primary trench 130a corresponding to the open part may be formed from one surface of the base substrate in the depth direction.

Figure 2:
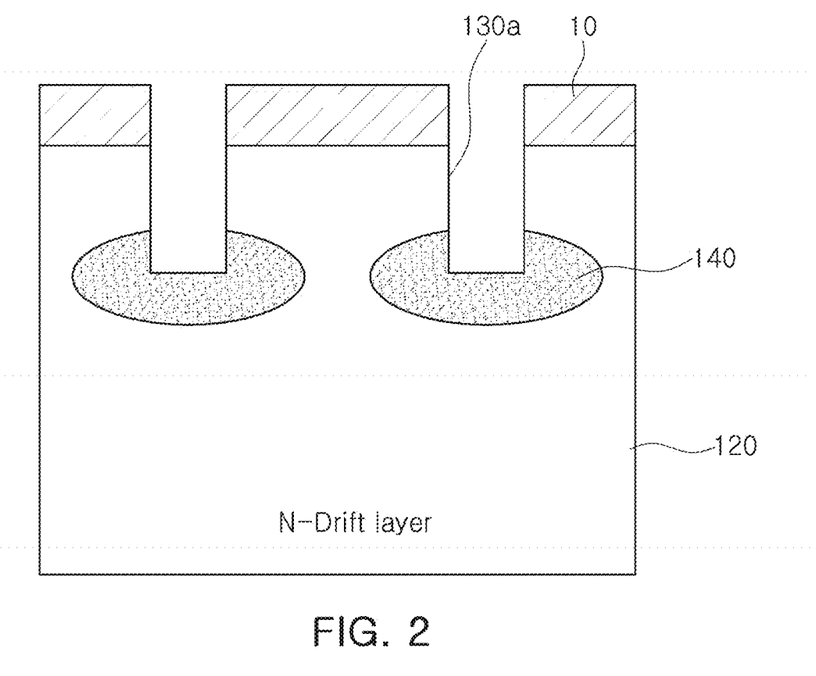
Figure 3:
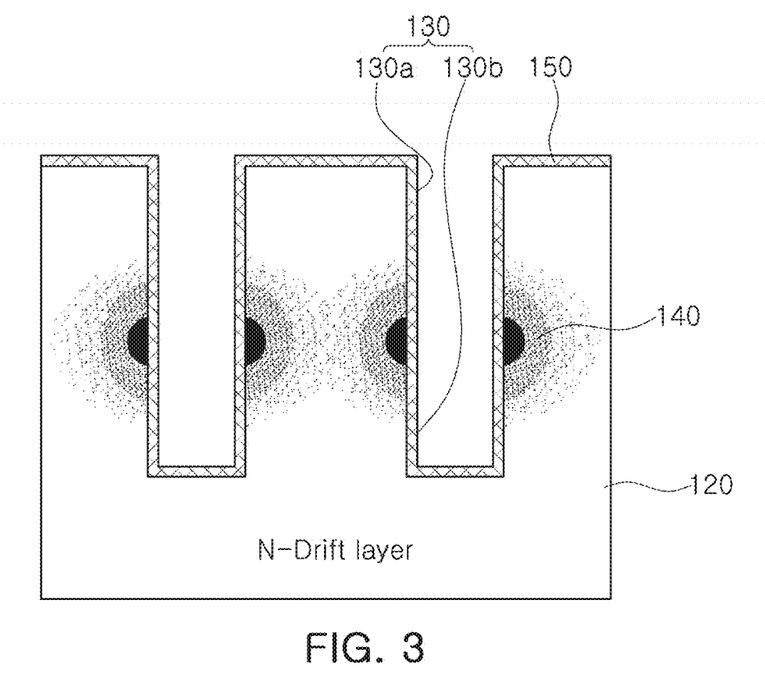

Then, referring to FIGS. 2 and 3, a first conductive type diffusion layer 140 having a concentration higher than that of the first conductive type drift layer 120 may be formed by performing the ion implantation and thermal diffusion process on the primary trench 130a.

In this case, the first conductive type diffusion layer 140 may be formed to have a concentration higher than that of the first conductive type drift layer 120.

For example, the diffusion layer 140 may have a conductive type corresponding to an N0 type.

Since the diffusion layer 140 is formed only at a lower portion of the primary trench 130a using the etching mask 10 and not formed at an end portion region of the power semiconductor device, a decrease in breakdown voltage of the power semiconductor device, or the like, may be prevented, such that reliability of the power semiconductor device may be improved.

Next, referring to FIG. 3, a secondary trench 130b may be formed so as to be extended from a lower surface of the primary trench 130a in the depth direction and penetrating through the first conductive type diffusion layer 140, such that a final trench (130 of FIG. 3) may be completed.

That is, as illustrated in FIG. 3, the trench 130 may be formed by two times trench processing.

In addition, a peak point of an impurity doping profile of the first conductive type diffusion layer 140 in the depth direction according to the ion implantation as described above may be positioned in a region between a lower surface of a well layer (170 of FIG. 6) and a lower surface of the secondary trench 130b. A more detailed description thereof will be provided below.

In a process of forming the first conductive type diffusion layer 140, the peak point of the impurity doping profile in the depth direction needs to be formed below the well layer (170 of FIG. 6) and considered so as not to depart from the lower surface of the secondary trench 130b at the time of ion implantation.

As illustrated in FIG. 3, the first conductive type diffusion layer 140 may be formed in a semicircular shape on at least one side based on the primary and secondary trenches 130a and 130b (hereinafter, referred to as 130).

In more detail, the first conductive type diffusion layer 140 formed in a circular or oval shape (except for a primary trench region) based on the lower surface of the primary trench 130a as illustrated in FIG. 2 may be formed in each of the semicircular shapes due to processing of the secondary trench 130b.

That is, the diffusion layer 140 is formed in the semicircular shape between the primary and secondary trenches 130a and 130b adjacent to each other as illustrated in FIG. 3, such that semi-circles may contact each other to thereby form a single layer. In addition, a peak point of the impurity doping profile of the first conductive type diffusion layer 140 in a transverse direction according to the ion implantation as described above may be positioned in a region contacting side surfaces of the primary and secondary trenches 130a and 130b.

That is, in the impurity doping profile of the diffusion layer 140, as a distance from the trench 130 is increased, an impurity concentration value may be gradually decreased.

Therefore, the diffusion layer has a lowest impurity concentration value in a central portion between the trenches 130 adjacent to each other. A more detailed description thereof will be provided below.

Figure 4:
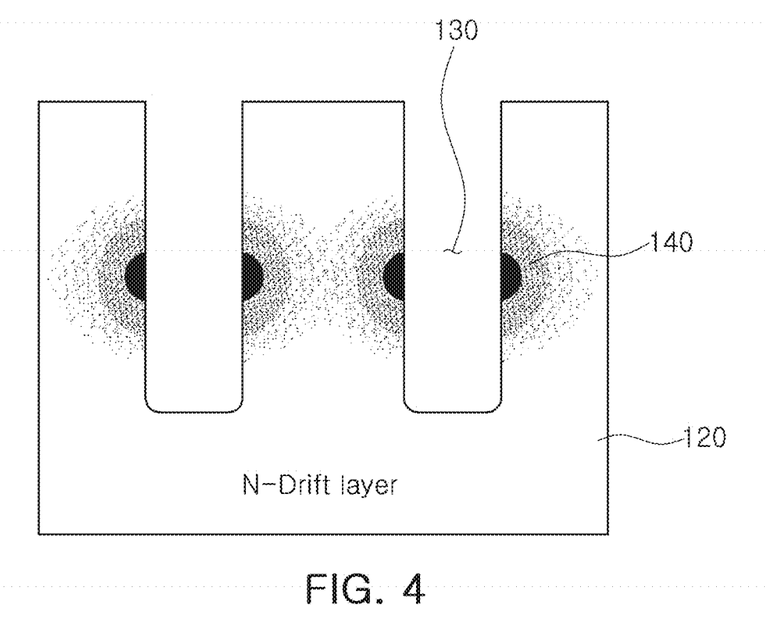

Next, as illustrated in FIG. 4, the etching mask 10 may be removed.

Figure 5:
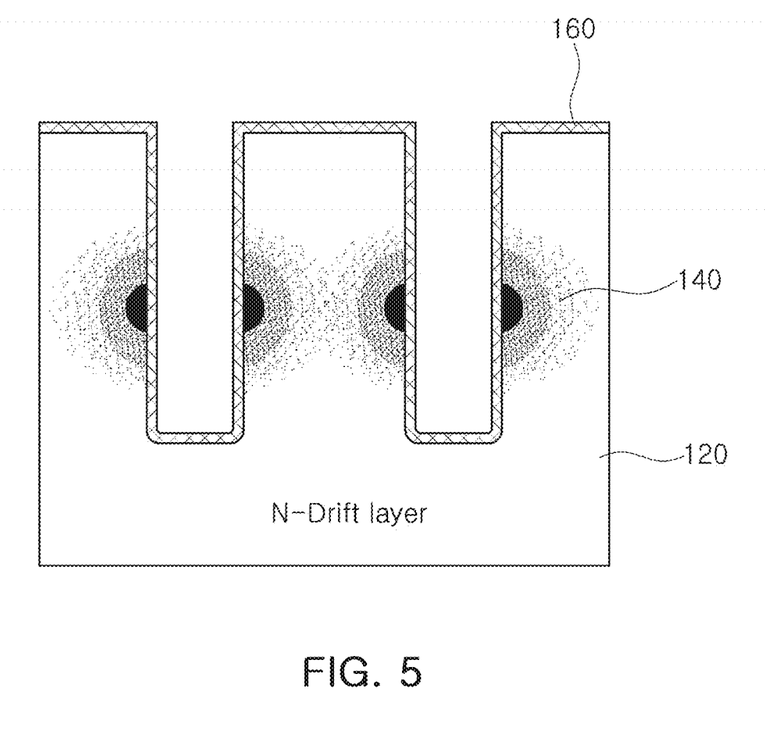

Then, as illustrated in FIG. 5, a first insulation film 160 may be formed on one surface of the base substrate including inner walls of the primary and secondary trenches 130a and 130b.

In this case, the first insulation film 160 may be a gate oxide film, but is not limited thereto.

For example, the first insulation film 160 may be formed of $SiO_2$, but is not limited thereto.

Figure 6:
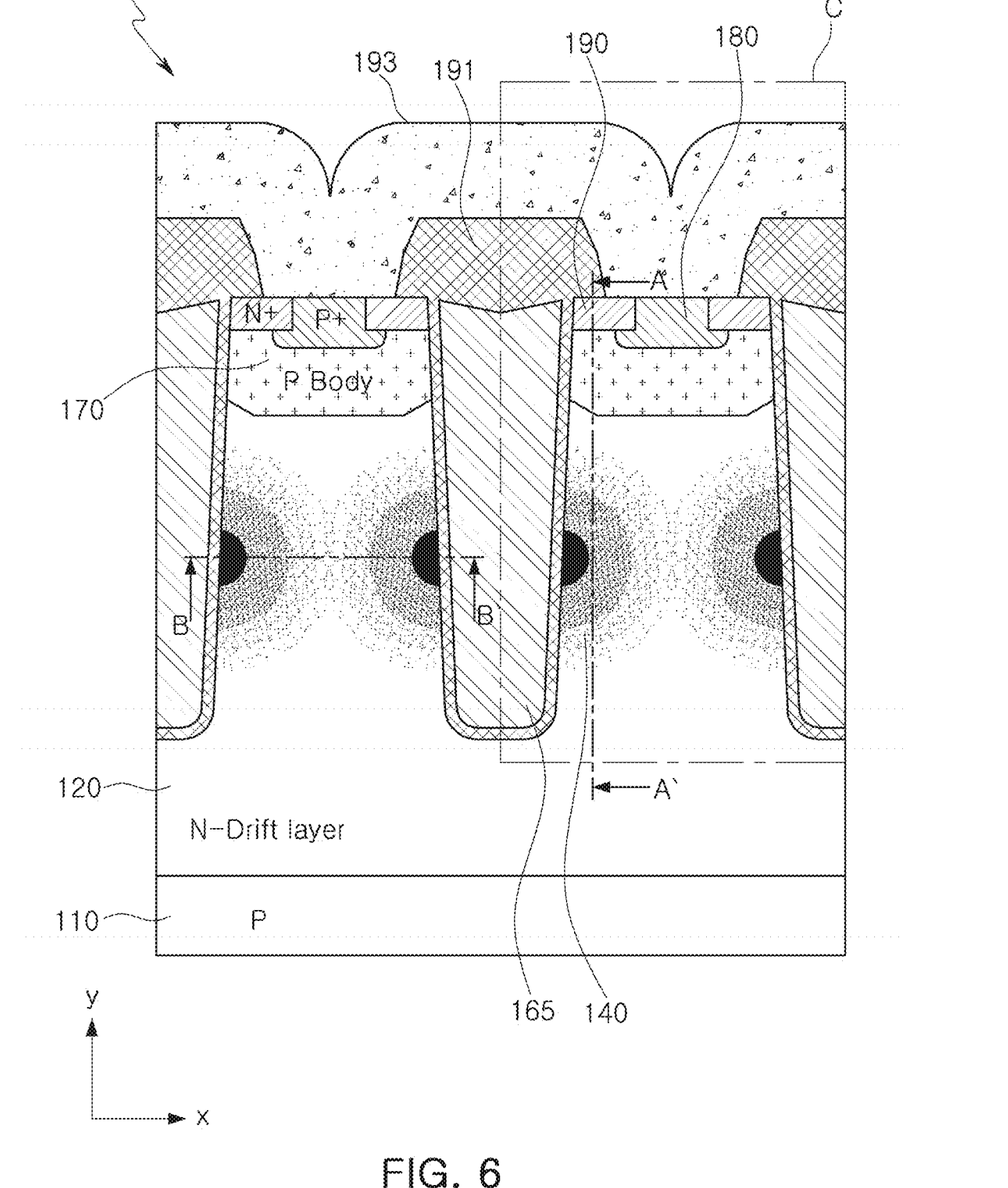

Then, as illustrated in FIG. 6, a first electrode 165 may be formed in the primary and secondary trenches 130, and a well layer 170 may be formed by implanting second conductive type impurities into one surface of the base substrate.

The well layer 170 may be formed by implanting the second conductive type impurities into one surface of the base substrate so that a peak point of a doping profile of the well layer 170 is positioned in one surface of the base substrate.

The first electrode 165 may be a gate electrode and be formed of poly-silicon, but is not limited thereto.

Meanwhile, as illustrated in FIGS. 3 and 4, a second insulation film 150 may be formed on one surface of the base substrate including inner walls of the primary and secondary trenches 130 and removed, after the removing of the etching mask 10 and before forming of the first insulation film 160.

In this case, the second insulation film 150 may be a sacrificial oxide film.

A process of forming and removing the sacrificial oxide film, which is a process of softly polishing regions of the primary and secondary trenches 130, is a process for removing cracks and defects that may occur at the time of trench processing to thereby significantly decrease defect that will occur thereafter.

As illustrated in FIG. 6, the primary and secondary trenches may be provided in plural.

Referring to FIG. 6, the method of manufacturing a power semiconductor device may include, after forming of the second conductive type well layer 70, forming second electrode regions 190 at both of the outer walls of the plurality of primary and secondary trenches 130 in an upper portion of the second conductive type well layer 170, respectively; forming a second conductive type body region 180 having a concentration higher than that of the second conductive type well layer 170 between the second electrode regions 190 in the upper portion of the second conductive type well layer 170; forming a third insulation film 191 on the first trench 130a in one surface of the base substrate so as to contact the first insulation film 160 and the first electrode 165; and forming a second electrode 193 on one surface of the base substrate including the third insulation film 191.

The above mentioned second electrode region 190 may be a first conductive type emitter region, and the second electrode 193 may be an emitter electrode.

In addition, the second electrode region 190 may be an N+ type region having a concentration higher than that of the diffusion layer 140, and the body region 180 may be a P+ type region having a concentration higher than that of the well layer, but the present disclosure is not limited thereto.

The second electrode region 190 may be provided in plural as illustrated in FIG. 6, and each of the second electrode regions 190 may be formed to be spaced apart from each other.

Next, as illustrated in FIG. 6, a second conductive type semiconductor substrate 110 may be formed on a lower surface of the first conductive type drift layer 120 in the depth direction of the base substrate.

The second conductive type semiconductor substrate 110 may be formed of a silicon wafer, but is not limited thereto.

Power Semiconductor Device

FIG. 6 is a cross-sectional view schematically illustrating a configuration of a power semiconductor device according to an exemplary embodiment of the present disclosure.

As illustrated in FIG. 6, the power semiconductor device 100 may include a based substrate having one surface and the other surface opposing the one surface and formed of a first conductive type drift layer 120; a first conductive type diffusion layer 140 formed on the base substrate and having an impurity concentration higher than that of the first conductive type drift layer 120; a second conductive type well layer 170 formed inside of one surface of the base substrate; a trench 130 formed from one surface of the base substrate including the well layer 170 so as to penetrate through the diffusion layer 140 in a depth direction; a first insulation film 160 formed on a surface of the base substrate including an inner wall of the trench 130; and a first electrode 165 formed in the trench.

Meanwhile, as illustrated in FIG. 6, the first conductive type diffusion layers 140 may be formed in a semicircular shape at both sides based on the trench 130, respectively.

That is, as illustrated in FIG. 6, the diffusion layer 140 is formed in the semicircular shape between trenches 130 adjacent to each other, such that semicircles contact each other to thereby form a single layer.

In addition, the first insulation film 160 may be a gate oxide film.

Meanwhile, as illustrated in FIG. 6, the number of trenches 130 may be plural.

The power semiconductor device 100 may further include second electrode regions 190 formed at both of the outer walls of the plurality of trenches 130 in an upper portion of the second conductive type well layer 170, respectively; a second conductive type body region 180 formed between the second electrode regions 190 in the upper portion of the second conductive type well layer 170 and having an impurity concentration higher than that of the second conductive type well layer 170; a third insulation film 191 formed on the trench 130 in one surface of the base substrate so as to contact the first insulation film 160 and the first electrode 165; and a second electrode 193 formed on one surface of the base substrate including the third insulation film 191.

The second electrode region 190 may be a first conductive type emitter region, and the second electrode 193 may be an emitter electrode.

Although not shown, in the power semiconductor device 100, a third electrode (not shown) may be formed on a lower surface of the second conductive type semiconductor substrate 110. The third electrode may be a collector electrode, and the second conductive type semiconductor substrate 110 may be operated as a collector region.

Figure 7:
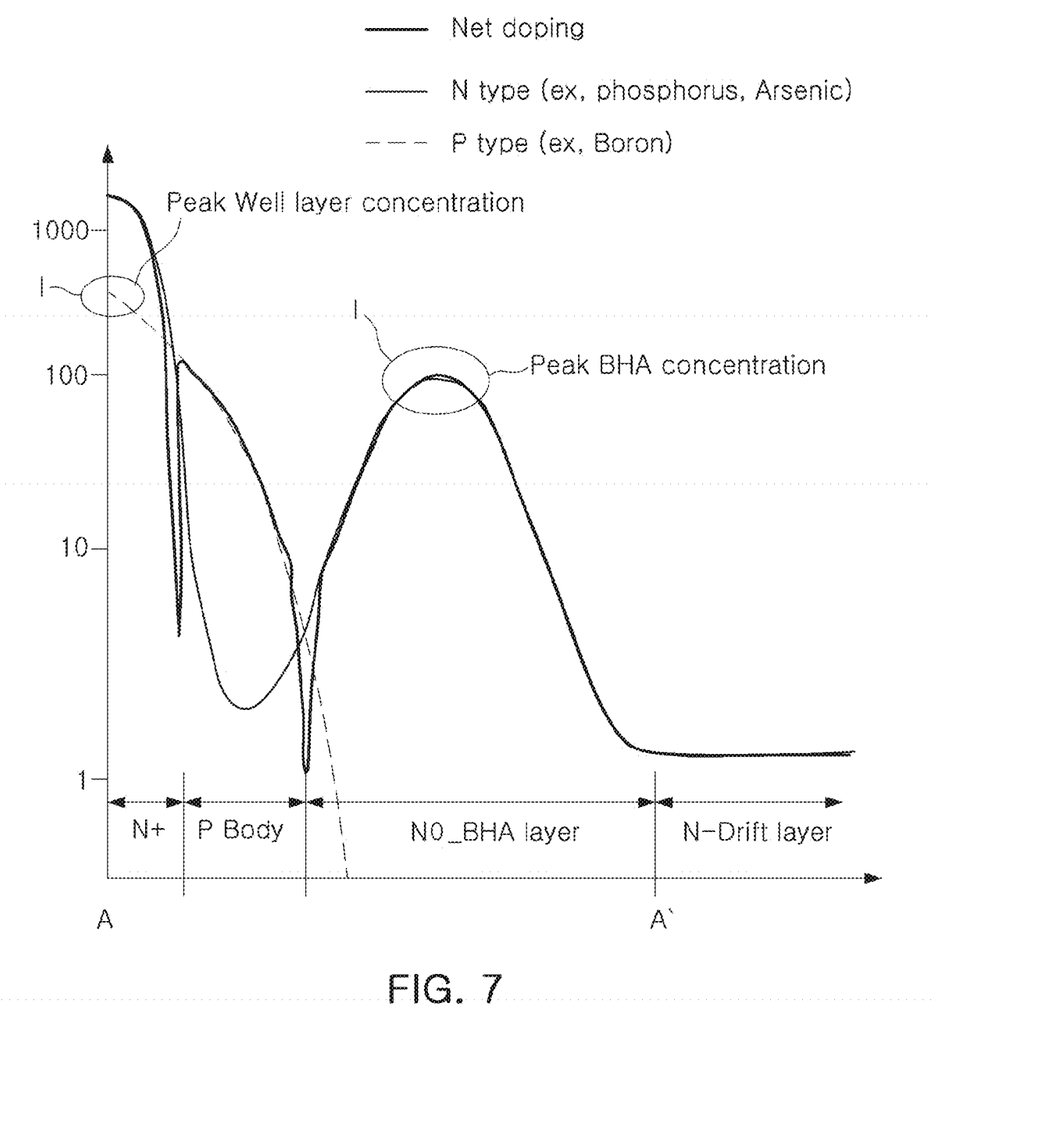
FIG. 7 is a graph illustrating doping profile for each of the regions based on line A-A' of FIG. 6.

FIG. 7 is a graph schematically illustrating a doping profile along line A-A' of FIG. 6. The doping profile of the power semiconductor device 100 in the depth direction will be described with reference to FIG. 7.

As illustrated in FIG. 7, the peak point I of the impurity doping profile of the first conductive type diffusion layer 140 in the depth direction may be position at a region between the lower surface of the second conductive type well layer 170 to the lower surface of the trench 130.

In this case, since a peak point of an impurity doping concentration of the first conductive type diffusion layer 140 in the depth direction, which is an I region, is formed at a point spaced apart from the second conductive type well layer 170 by a predetermined distance in the depth direction of the power semiconductor device, in the power semiconductor device according to the present disclosure, in spite of a decrease in a saturation voltage Vce(sat) at the time of operation, a change width of threshold voltage VGE(th) may be small.

In addition, referring to FIG. 7, it may be appreciated that a peak point I' of the impurity doping profile of the well layer 170 in the depth direction is positioned in one surface of the base substrate.

In FIG. 7, since the peak point I' of the impurity doping profile of the well layer 170 in the depth direction is positioned in one surface of the base substrate, an impurity concentration of the well layer 170 beneath of the N+ type second electrode region may be maintained to be significantly high.

Therefore, the power semiconductor device according to an exemplary embodiment of the present disclosure may decrease latch-up resistance.

That is, in the power semiconductor device according to an exemplary embodiment of the present disclosure, since the peak point of the impurity doping concentration of the diffusion layer 140 is formed at a point spaced apart from the well layer 170 by a predetermined distance, in the power semiconductor device according to the present disclosure, in spite of a decrease in a saturation voltage Vce(sat) at the time of operation, a change width of the threshold voltage VGE(th) may be small, and at the same time, the latch-up resistance may be decreased by maintaining the impurity concentration of the well layer 170 to be significantly high.

Figure 8:
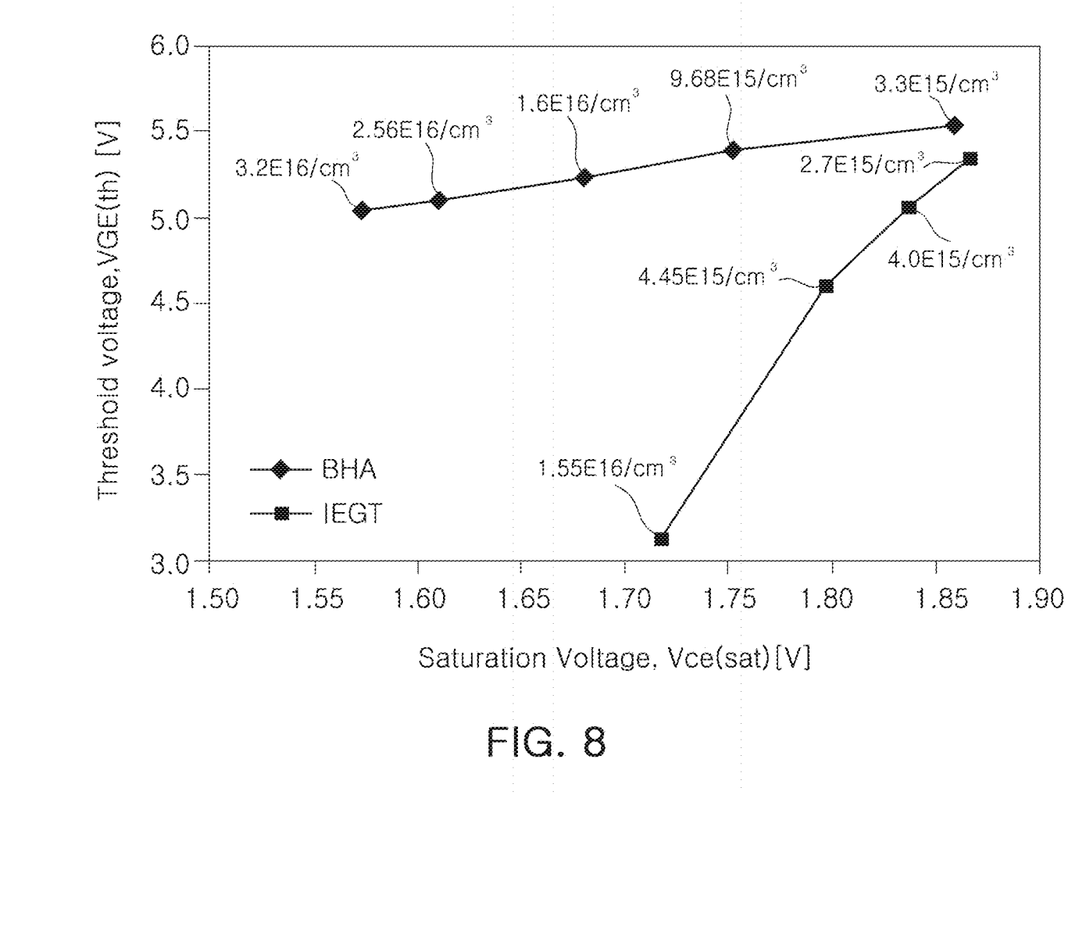
FIG. 8 is a graph schematically illustrating that a saturation voltage Vce(sat) and a threshold voltage VGE(th) are changed according to an impurity concentration of a diffusion layer.

FIG. 8 is a graph schematically illustrating that the Vce(sat) and VGE(th) are changed according to the impurity concentration of the diffusion layer 140.

Referring to FIG. 8, it may be appreciated that in the case of the power semiconductor device including the diffusion layer according to an exemplary embodiment of the present disclosure (that is, a buried hole accumulation IGBT (BHA IGBT)), a change width of the VGE(th) according to the impurity concentration of the diffusion layer 140 may be small, but in the case of an injection enhancement gate transistor (IEGT), a change with of VGE(th) according to the impurity concentration is significantly large.

In FIG. 8, a decrease in the saturation voltage Vce(sat) means an increase in the impurity concentration of the first conductive type diffusion layer 140.

In FIG. 8, even though the saturation voltage Vce(sat) is decreased, since the change with of the VGE(th) of the power semiconductor device (BHA IGBT) including the diffusion layer according to an exemplary embodiment of the present disclosure is not large, the impurity concentration of the diffusion layer 140 may be further increased.

Figure 9:
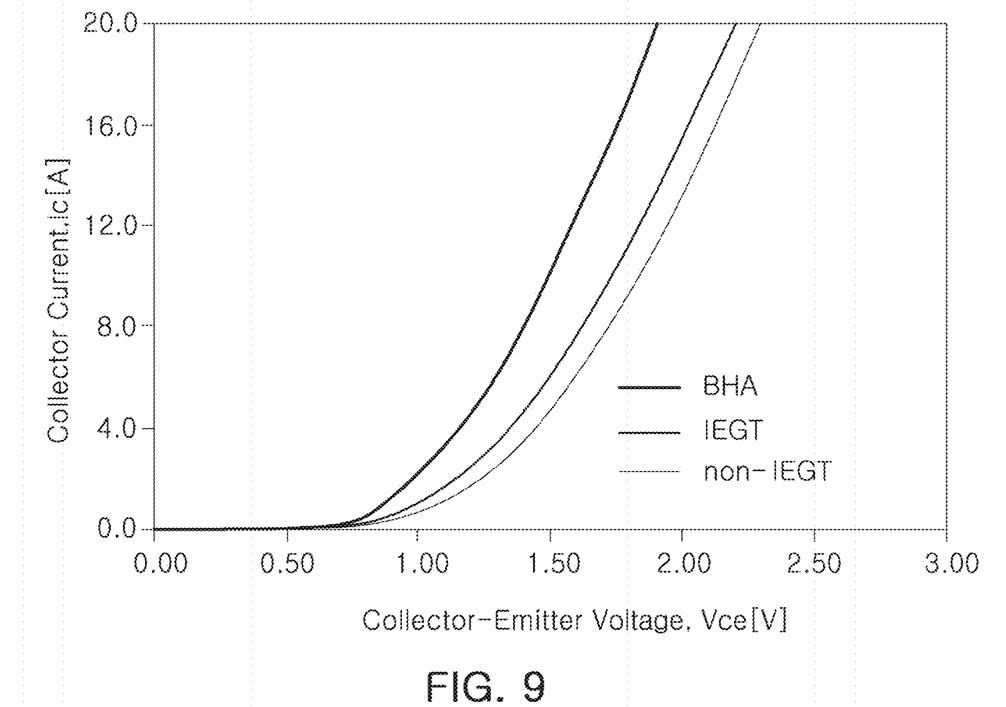
FIG. 9 is a graph obtained by measuring Ic according to a change in Vce.
Figure 10:
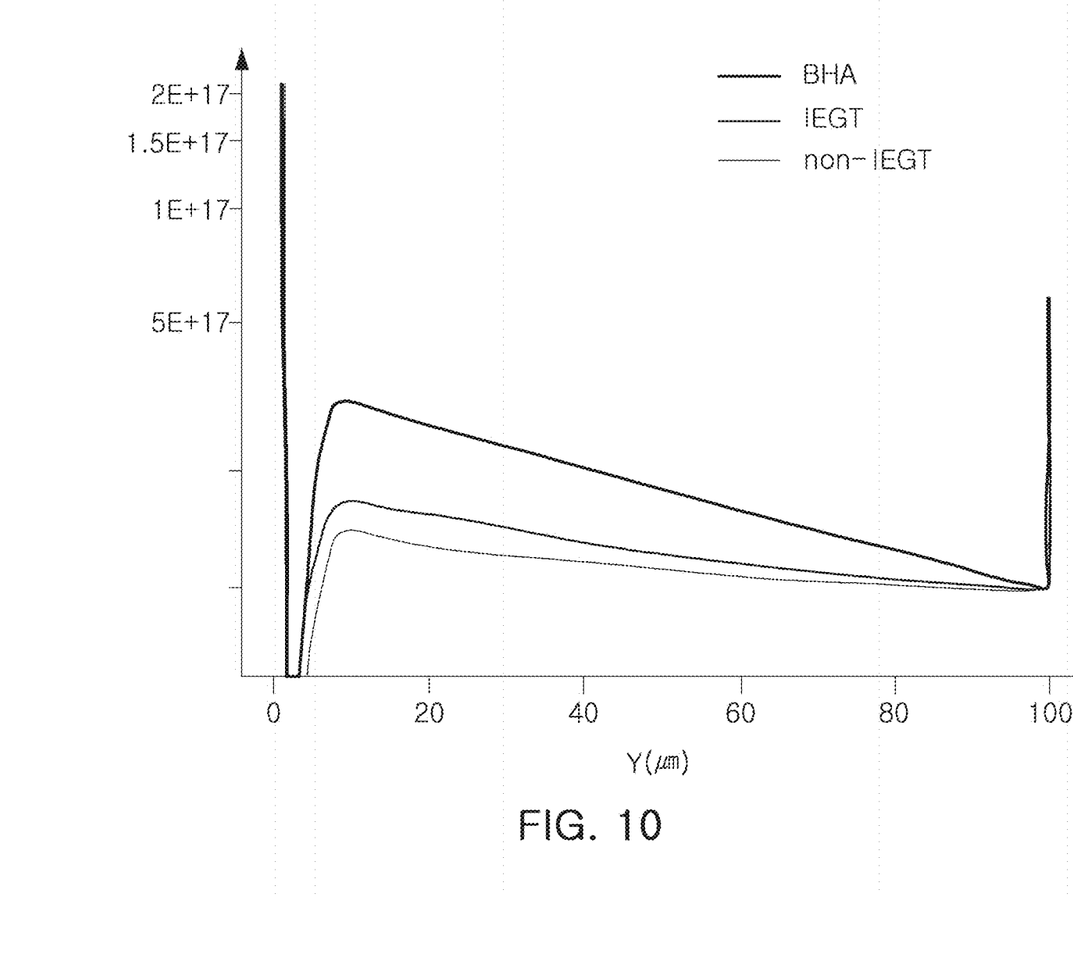
FIG. 10 is a graph illustrating a simulation result of an amount of holes accumulated according to a depth of the power semiconductor device in a depth direction.

FIG. 9 is a graph obtained by measuring Ic according to a change in the Vce, and FIG. 10 is a graph illustrating a simulation result of an amount of holes accumulated according to a depth of the power semiconductor device in a depth direction.

As illustrated in FIG. 9, it may be appreciated that in the power semiconductor device according to an exemplary embodiment of the present disclosure, the impurity concentration of the diffusion layer 140 is high, such that the Vce(sat) is low.

Particularly, it may be appreciated that in the case of the IEGT or a non-IEGT corresponding to a general IGBT, the Vce(sat) is significantly high as compared to the power semiconductor device according to an exemplary embodiment of the present disclosure.

At the same time, it may be appreciated that the amount of the accumulated holes is significantly high in the power semiconductor device (BHA IGBT) according to an exemplary embodiment of the present disclosure as compared to the IEGT or the non-IEGT corresponding to the general IGBT as illustrated in FIG. 10.

Therefore, in the power semiconductor device according to an exemplary embodiment of the present disclosure, a conductivity modulation phenomenon may be significantly increased, such that a conduction loss may be significantly decreased.

That is, in the power semiconductor device 100 according to an exemplary embodiment of the present disclosure, at the time of forming the diffusion layer 140, the impurities may be implanted at a high concentration as compared to the related art, and movement of the holes may be limited by the high concentration impurities, such that a switching speed of the power semiconductor device may be increased, and an entire operation of the device may be improved.

Figure 11:
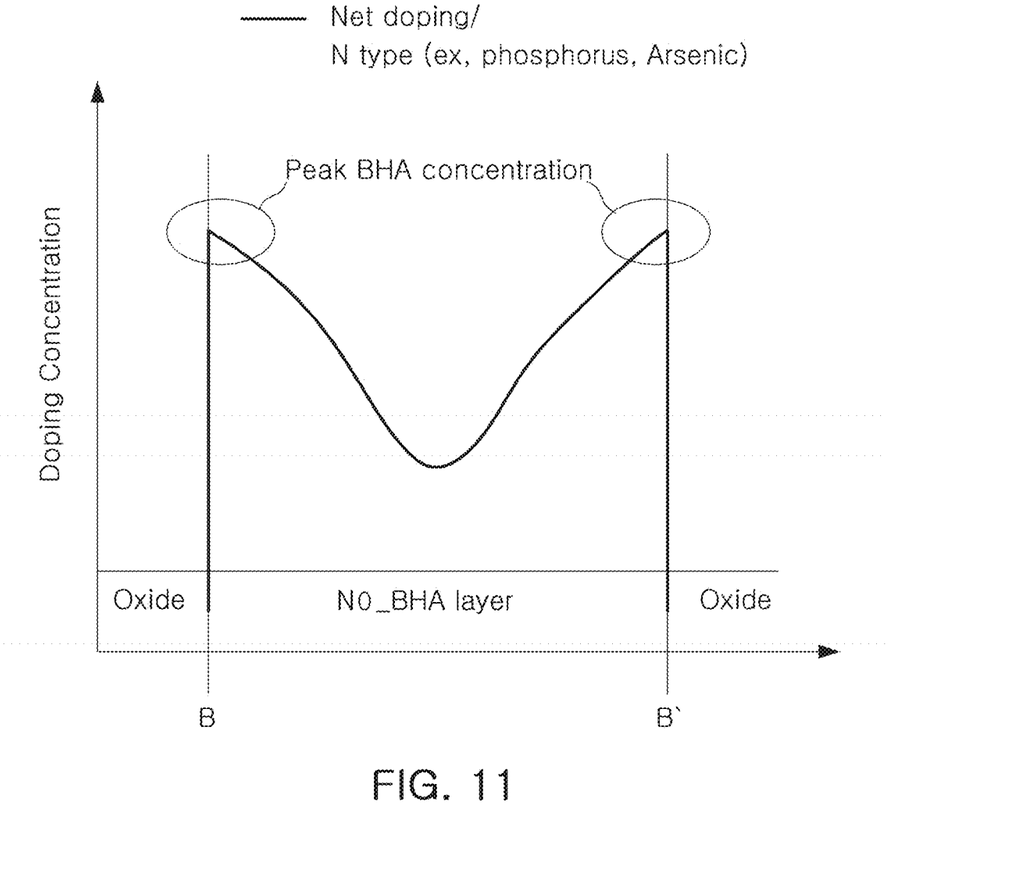
FIG. 11 is a graph illustrating a doping profile for each of the regions based on line B-B' of FIG. 6.

FIG. 11 is a graph schematically illustrating an impurity concentration along line B-B' of FIG. 6.

Referring to FIG. 11, a peak point of the impurity doping profile of the diffusion layer 140 in the transverse direction is positioned in a region contacting the side surface of the trench 130.

That is, in the impurity doping profile of the diffusion layer 140, as a distance from the trench 130 is increased in the transverse direction, an impurity concentration value may be gradually decreased.

Therefore, the diffusion layer 140 has a lowest impurity concentration value at the central portion between the trenches 130 adjacent to each other.

As described above, since the diffusion layer 140 has a lowest impurity concentration value at the central portion between the trenches 130 adjacent to each other, when high current flows at the time of turn-on of the power semiconductor device, a path through which the hole may move is formed, such that the power semiconductor device may have an excellent property against latch-up.

Figure 12:
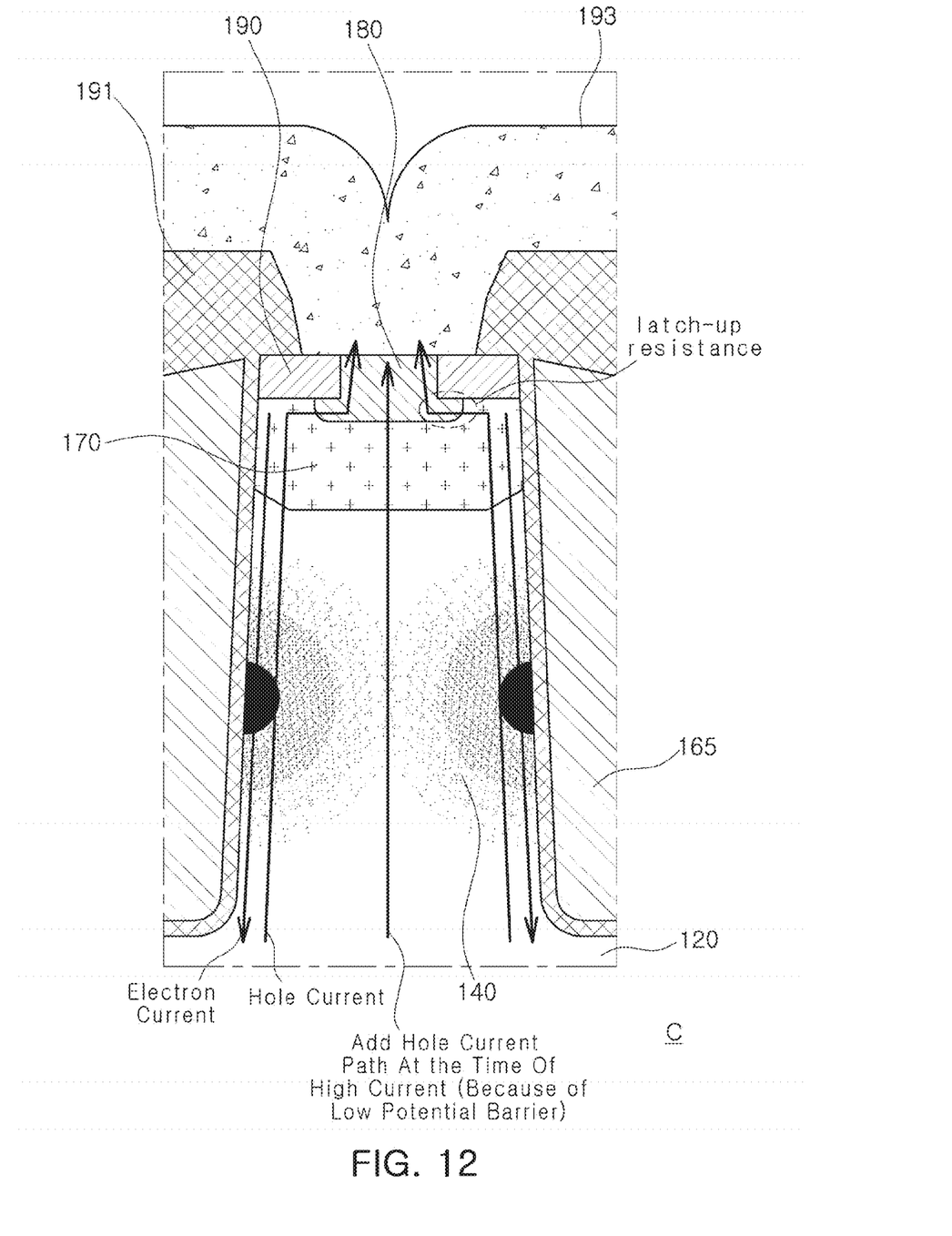

FIG. 12 is a cross-sectional view schematically illustrating flows of electron current and hole current when the power semiconductor device is turned on.

Since the second conductive type semiconductor substrate 110 is formed by implanting second conductive type impurities on the lower surface of the base substrate according to an exemplary embodiment of the present disclosure, the power semiconductor device may have a parasitic thyristor having a pnpn structure from the lower portion.

When the parasitic thyristor operates once, the IGBT is in a state in which the IGBT is not controlled by the gate anymore, such that a vast amount of current flows toward positive and negative electrodes. Therefore, high heat may be generated, such that the device is burned.

A phenomenon that the parasitic thyristor is turned on as described above is referred as latch-up.

The principle that latch-up occurs will be described in detail. When the power semiconductor device operates, the electron current may flow along a channel formed at the side surface of the trench as a1.

The hole current is pulled by the electron current to thereby flow beside the electron current as a2, pass through a junction surface of the well layer 170, and flows toward the second electrode 193.

Since the electron current is implanted into the drift layer 120 at a lower end of the trench 130 along the channel to increase conductivity at this region, the hole current is mostly implanted to the well layer 170 at a lower end of the channel to flow toward an emitter metal layer 160 through a lower end of the second electrode region 190.

When higher current flows in the power semiconductor device to increase hole current and accordingly, a voltage drop at a lower end D of the second electrode region is larger than a potential barrier of an interface between the second electrode region 190 and the well layer 170, junction is in forward bias, such that electrons are implanted from the second electrode region 190 to the well layer 170, and a parasitic npnp thyristor composed of the N+ type second electrode region 190, the P-type well layer 170, the N-type drift region 120, and the p-type semiconductor substrate 110 may be operated.

Therefore, there is a need for preventing the hole current from being increased at the lower end of the second electrode region 190.

In the power semiconductor device according to an exemplary embodiment of the present disclosure, since the diffusion layer 140 has a lowest impurity concentration value at the central portion between the trenches 130 adjacent to each other, when high current flows at the time of turn-on of the power semiconductor device, a path a3 through which the hole may move is formed, such that the power semiconductor device may have an excellent property against latch-up.

That is, when high current flows at the time of turn-on of the power semiconductor device, since the impurity concentration at the central portion between the trenches 130 adjacent to each other is low, the hole current may flow in the corresponding portion.

Therefore, a flow of the hole current toward the lower end D of the second electrode region 190 may be prevented, such that generation of latch-up may be prevented.

As set forth above, in the power semiconductor device and a method of manufacturing the same according to exemplary embodiments of the present disclosure, since the first conductive type diffusion layer having an impurity concentration higher than that of the first conductive type drift layer is formed between the trenches, movement of the holes may be limited, such that the conduction loss of the power semiconductor device may be decreased.

In the power semiconductor device and a method of manufacturing the same according to exemplary embodiments of the present disclosure, as the secondary trench processing is applied, since the peak point of the impurity doping concentration of the first conductive type diffusion layer in a thickness direction is formed to be spaced apart from the well layer, the change width of the threshold voltage at the time of turn-on of the power semiconductor device including the insulated gate bipolar transistor (IGBT) device may be decreased.

Further, in the power semiconductor device and a method of manufacturing the same according to exemplary embodiments of the present disclosure, since the peak point of the impurity doping concentration of the first conductive type diffusion layer having an impurity concentration higher than that of the first conductive type drift layer in a width direction is positioned at the region contacting the side surface of the trench, when high current flows, the path through which the hole may move may be formed at the central portion between the trenches, such that the power semiconductor device may have the excellent property against the latch-up.

While exemplary embodiments have been shown and described above, it will be apparent to those skilled in the art that modifications and variations could be made without departing from the spirit and scope of the present disclosure as defined by the appended claims.

What is claimed is:

1. A power semiconductor device comprising:
   a base substrate having one surface and an other surface opposing the one surface and comprising a first conductive type drift layer;
   a second conductive type semiconductor substrate disposed on the other surface of the base substrate;
   a second conductive type well layer disposed under the one surface of the base substrate;
   a first conductive type diffusion layer disposed in the base substrate, formed to be spaced apart from the well layer in a first direction, and having an impurity concentration higher than that of the drift layer;
   a trench formed from the one surface of the base substrate including the well layer so as to penetrate through the diffusion layer in the first direction;
   an insulation film disposed on the one surface of the base substrate including an inner wall of the trench; and
   a first electrode disposed in the trench,
   wherein a peak point of an impurity doping concentration of the diffusion layer in a second direction perpendicular to the first direction is positioned in a region contacting a side surface of the trench.

2. The power semiconductor device of claim 1, wherein the first direction is a depth direction, and the second direction is a transverse direction.

3. The power semiconductor device of claim 1, wherein a peak point of an impurity doping profile of the diffusion layer in the first direction is positioned in a region between a lower surface of the well layer and a lower surface of the trench.

4. The power semiconductor device of claim 1, wherein a peak point of an impurity doping profile of the well layer in the first direction is positioned in the one surface of the base substrate.

5. The power semiconductor device of claim 1, wherein the diffusion layer is formed in a semicircular shape on at least one side of a central portion of the trench and partially overlaps with another diffusion layer adjacent thereto.

6. The power semiconductor device of claim 1, wherein a peak point of an impurity doping profile of the diffusion layer in the first direction is formed to be spaced apart from the well layer in the first direction.

7. A power semiconductor device comprising:
a base substrate having one surface and an other surface opposing the one surface and comprising a first conductive type drift layer;
a second conductive type semiconductor substrate formed on the other surface of the base substrate;
a second conductive type well layer formed under the one surface of the base substrate;
a first conductive type diffusion layer formed in the base substrate, formed to be spaced apart from the well layer in a depth direction, and having an impurity concentration higher than that of the drift layer;
a trench formed from the one surface of the base substrate including the well layer so as to penetrate through the diffusion layer in the depth direction;
a first insulation film formed on the one surface of the base substrate including an inner wall of the trench; and
a first electrode formed in the trench,
wherein a peak point of an impurity doping profile of the diffusion layer in the depth direction is positioned in a region between a lower surface of the well layer and a lower surface of the trench.

* * * * *